United States Patent [19]

Maruyama

[11] Patent Number: 4,739,198

[45] Date of Patent: Apr. 19, 1988

[54] SIGNAL OUTPUT CIRCUIT OF A PUSH-PULL TYPE

[75] Inventor: Shigeru Maruyama, Tokyo, Japan

[73] Assignee: NEC Corporation, Tokyo, Japan

[21] Appl. No.: 838,499

[22] Filed: Mar. 11, 1986

[30] Foreign Application Priority Data

Mar. 11, 1985 [JP] Japan .................................. 60-47733

[51] Int. Cl.[4] .................. H03K 17/16; H03K 19/017; H03K 19/003; H03K 17/04

[52] U.S. Cl. .................................. 307/530; 307/473; 307/270; 307/475; 307/451; 365/228; 365/196; 365/208

[58] Field of Search .............. 307/473, 475, 530, 270, 307/443, 450, 451; 365/226, 228, 189, 191, 195, 196, 203, 207, 208

[56] References Cited

U.S. PATENT DOCUMENTS

| | | | |
|---|---|---|---|
| 4,425,517 | 1/1984 | Smith | 307/473 |
| 4,435,658 | 3/1984 | Murray et al. | 307/473 X |
| 4,540,904 | 9/1985 | Ennis et al. | 307/473 |
| 4,621,208 | 11/1986 | van Tran | 307/473 |
| 4,638,187 | 1/1987 | Boler et al. | 307/473 X |
| 4,644,196 | 2/1987 | Flannagan | 307/473 X |
| 4,649,298 | 3/1987 | Tuhy, Jr. | 307/473 |

Primary Examiner—Stanley D. Miller
Assistant Examiner—David R. Bertelson
Attorney, Agent, or Firm—Sughrue, Mion, Zinn, Macpeak, and Seas

[57] ABSTRACT

An output circuit of a push-pull type is disclosed. The output circuit includes first and second transistors connected in series, means responsive to a data signal for producing true and complementary signals of the data signal, and means for supplying the true and complementary signals to the first and second transistors. The output circuit further includes means for generating one-shot pulse at a transition time when the true and complementary signals are changed in their logic levels and means response to said one-shot pulse for turning said first and second transistors OFF. A large current flowing at the transition time is thereby prevented.

7 Claims, 7 Drawing Sheets

SIGNAL OUTPUT CIRCUIT OF A PUSH-PULL TYPE

BACKGROUND OF THE INVENTION

The present invention relates to a signal output circuit of a push-pull type, and more particularly to a data output circuit employed in a semiconductor memory equipped with multistage sense amplifiers.

A signal output circuit of a push-pull type comprises first and second transistors connected in series between power supply terminals. The connection point of the first and second transistors is connected to a signal output terminal. True and complementary data signals to be outputted are supplied to the first and second transistors in such a manner that these transistors attain a push-pull operation. In a steady condition, one of the first and second transistors is a nonconducting state, and hence no penetrating current flows between the power supply terminals.

However, in response to change in a logic level of the data signals, one of the first and second transistors is brought from a nonconducting state to a conducting state, whereas the other of them is brought from a conducting state to a nonconducting state. In other words, both of the first and second transistors are made conducting at a transition time when the data signal changes its logic level, so that a penetrating current flows between the power terminals. The current ability of the first and second transistors is designed to be large to obtain a sufficient load driving capability. For this reason, the penetrating current is considerably large.

Such a large penetrating current increases a power consumption and further supplies a large noise signal to a signal processing section due to the impedance in power supply lines, thereby causing a misoperation and/or a data destruction.

SUMMARY OF THE INVENTION

Therefore, an object of the present invention is to provide an improved signal output circuit of a push-pull type.

Another object of the present invention is to provide a signal output circuit operable with a reduced penetrating current without lowering of an operation speed.

Still another object of the present invention is to provide a semiconductor memory equipped with an improved data output circuit.

An output circuit according to the present invention comprises first and second transistors attaining a push-pull operation in response to a data signal, and means responsive to a signal which is used for changing a logic level of the data signal for supplying to control electrodes of the first and second transistors a logic level such that these transistors are made nonconducting to bring a signal output terminal into a high impedance state when the logic level of the data signal is changed.

Thus, both of the first and second transistors are made nonconducting at a transition time when the logic level of the data signal is changed, so that an extremely small or no penetrating current flows. The first and second transistors respond to the data signal after the transition time when its logic level changes, and therefore only a charging or discharging current to a load flows.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
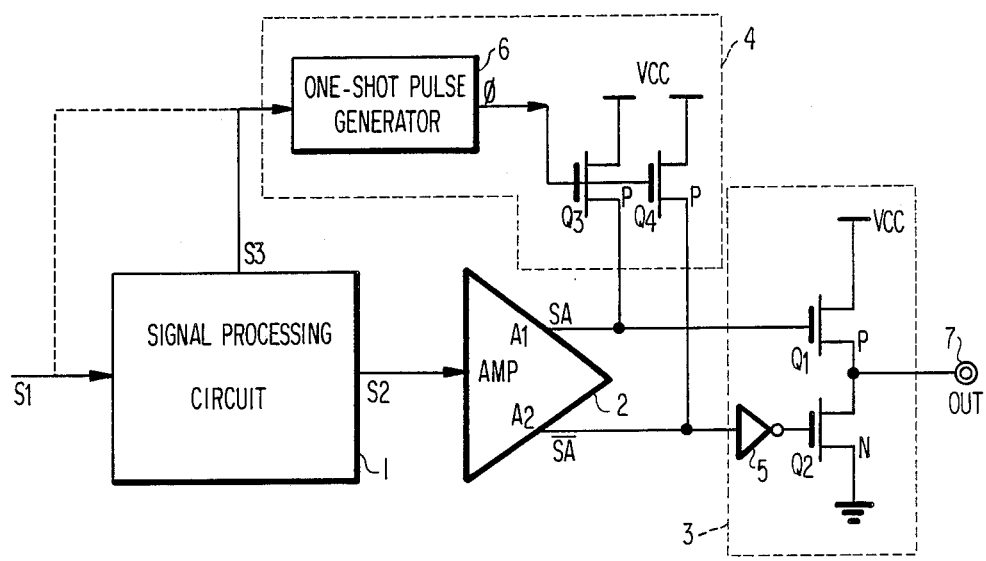
FIG. 1 is a block diagram showing a first embodiment of the present invention.
Figure 2:
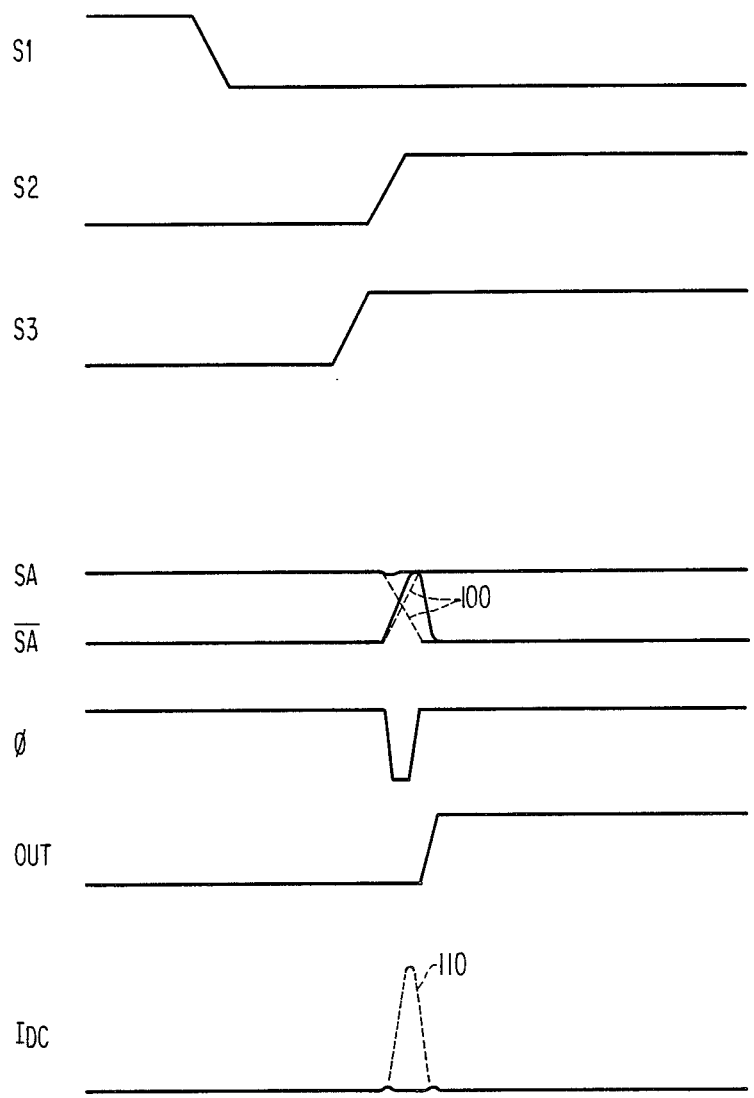
FIG. 2 is a timing chart representing an operation of a circuit shown in FIG. 1.

FIG. 1 shows a first embodiment of the present invention and FIG. 2 is a time chart for explaining its circuit operation.

A block represented as a signal processing circuit 1 is a micro processor, a logic gate circuit, or a semiconductor memory. This circuit 1 receives a signal S1 and attains the processing based on this signal to generate a data signal S2. The data signal S2 is supplied to an amplifier 2. The amplifier 2 has one pair of output terminals $A_1$ and $A_2$ and outputs therefrom true and complementary signals SA and $\overline{SA}$ of the data signal S2. These signals SA and $\overline{SA}$ are supplied to an output circuit 3. The output circuit 3 includes a P-channel MOS (Metal-Oxide-Semiconductor) transistor $Q_1$ connected between a first power terminal (Vcc) and an signal output terminal 7 and an N-channel MOS transistor $Q_2$ connected between a second power terminal (GND) and the output terminal 7. The signal SA is supplied to the gate of the transistor $Q_1$, and the signal $\overline{SA}$ is supplied via an inverter 5 to the gate of the transistor $Q_2$. In this embodiment, the first power terminal is supplied with a positive voltage of Vcc, and the second power terminal is grounded.

As shown in FIG. 2, assuming that the data signal S2 is a low level and thus the signals SA and $\overline{SA}$ are a high level and a low level, respeotively, the transistor $Q_2$ is in a conducting state to produce a low level output signal OUT from the output terminal 7. When the signal S1 changes, the signal processing responsive to this change is carried out by the circuit 1. As a result of the signal processing, the circuit 1 changes the data signal S2 from the low level to the high level.

If a penetrating current preventing circuit 4 is absent, the output signal SA of the amplifier 2 is changed from the high level to the low level and the other output signal $\overline{SA}$ is changed from the low level to the high level in response to the level chage of the data signal S2, as represented by a dotted line 100 in FIG. 2. In a transition period of this change, both of the transistors $Q_1$ and $Q_2$ are made conductive. The current ability of the transistors $Q_1$ and $Q_2$ are made large to drive a load coupled to the terminal 7. For this reason, a considerably large penetrating current $I_{DC}$ represented by a dotted line 110 in FIG. 2 flows between the power terminals due to the conduction of both transistors $Q_1$ and $Q_2$.

Such a large current is prevented by the circuit 4 which comprises a P-channel MOS transistor $Q_3$ connected between the first power terminal (Vcc) and the output terminal $A_1$ of the amplifier 2, a P-channel MOS transistor $Q_4$ connected between the first power terminal and the second output terminal $A_2$ of the amplifier 2, and a one-shot pulse generator 6 generating a one-shot pulse signal $\phi$ supplied to the gates of the transistors $Q_3$ and $Q_4$. The generator 6 responds to a signal S3 produced from the signal processing circuit 1 before the level change of the data signal S2 and generates the pulse signal $\phi$ in synchronism substantially with the level change of the output signals SA and $\overline{SA}$ of the amplifier 2. The pulse width of the one-shot signal $\phi$ is designed to be approximately equal to a time required to complete the level change of the signals SA and $\overline{SA}$. The pulse width may be longer, but in that case the generation of the output data is delayed.

The one-shot signal $\phi$ turns the transistors $Q_3$ and $Q_4$ ON when the amplifier 2 intends to change the levels of the signals SA and $\overline{SA}$ in response to the data signal S2. Accordingly, as shown by a solid line in FIG. 2, the gate level of the transistor $Q_1$ is maintained at the high level and the input level of the inverter 5 is inverted to the high level, thereby inverting the gate level of the transistor $Q_2$ to the low level. Both of the transistors $Q_1$ and $Q_2$ are made nonconducting. When the one-shot signal $\phi$ disappears, only the signal SA is inverted to the low level to turn the transistor $Q_1$ ON, so that the data output terminal 7 is changed to the high level. At this time, the transistor $Q_2$ is in the substantially nonconducting state. As a result, the penetrating current $I_{DC}$ is reduced extremely as shown by a solid line in FIG. 2. The large current shown by the line 110 is prevented.

As shown by a dotted line in FIG. 1, the one-shot pulse generator 6 can respond to the input signal S1 in place of the signal S3 to generate the one-shot signal $\phi$. In other words, the generator 6 generates the one-shot signal $\phi$ in response to a signal which is used for changing the data signal.

The signal processing circuit 2 can supply a control signal to the gates of the transistors $Q_3$ and $Q_4$ independently of the one shot signal, whereby a so-called tri-state circuit is realized.

Figure 3:
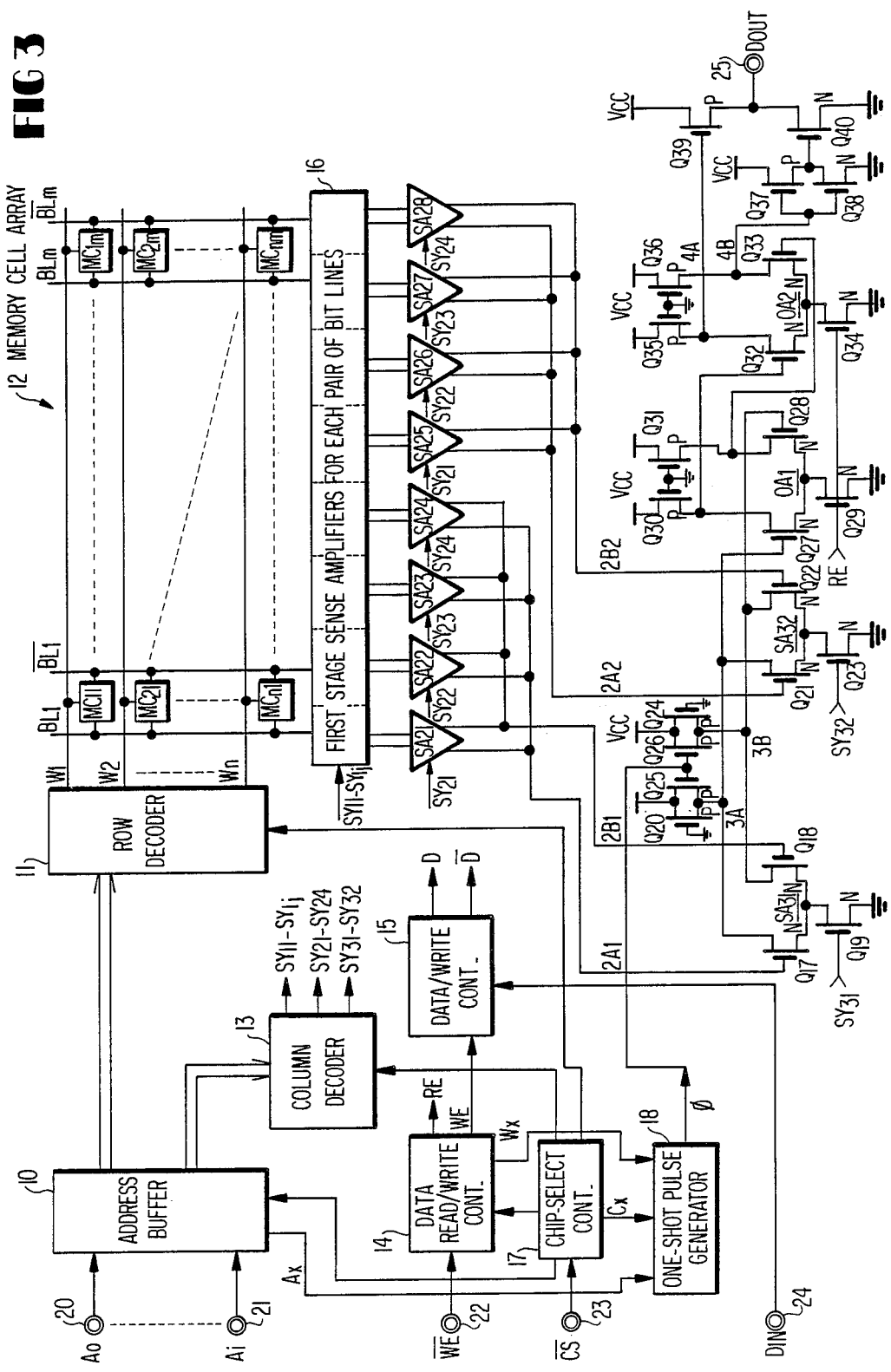
FIG. 3 is a block diagram showing a second embodiment of the present invention.

FIG. 3 shows a semiconductor memory, in particular a static type random access memory, as a second embodiment of the present invention. Address signals $A_0$ to $A_i$ are supplied to address terminals 20 to 21 and then introduced into an address buffer 10. Row address signals are supplied to a row decoder 11. The row decoder 11 selects one of word lines $W_l$ to $W_n$ in a memory cell array 12. The cell array 12 further includes a plurality of pairs of bit lines ($BL_1$ and $\overline{BL}_1$) to ($BL_m$ to $\overline{BL}_m$) and a plurality of static type memory cells $MC_{11}$ to $MC_{nm}$.

In a data-write operation mode, a write-enable signal $\overline{WE}$ supplied to a write-control terminal 22 assumes the low level, and a data write/read control circuit 14 activates a data-write control circuit 15 by a signal $\overline{WE}$. As a result, the control circuit 15 produces true and complementary signals D and $\overline{D}$ of an input data signal $D_{IN}$ supplied to a data input terminal 24. These data signal D and $\overline{D}$ are supplied through a selected bit line pair (BL and $\overline{BL}$) to a memory cell MC connected to the selected word line W to write the input data $D_{IN}$ therein. The detailed data-write circuit construction is omitted in FIG. 3, since it is not related directly to the present invention.

In a data-read operation mode, the signal $\overline{WE}$ takes the high level, and the data-write control signal 15 is inactivated. The data stored in memory cells MC which are connected to the word line W selected by the row decoder 11, appear on the bit line pairs BL's and $\overline{BL}$'s, respectively, and are then supplied to first-stage sense amplifiers 16. The first-stage sense amplifiers 16 are divided into eight blocks, and the output terminal of the sense amplifiers in each block are connected in common. A column decoder 13 energizes one of first-sense-enable signals $SY_{11}$ to $SY_{lj}$ in response to column address signals. The signals $SY_{ll}$ to $SY_{lj}$ are supplied to every block of the first-stage sense amplifiers 16. Accordingly, one sense amplifier in every block is activated by the energized first-sense-enable signal. In total, eight sense amplifires in the first-stage are activated. The true and complementary output signals of the first stage sense amplifiers in every block are supplied to eight second-stage sense amplifiers $SA_{21}$ to $SA_{28}$, respectively. The second-stage sense amplifiers are divided into two blocks, and the output terminals of the sense amplifiers in each block (i.e., $SA_{21}$ to $SA_{24}$ and $SA_{25}$ to $SA_{28}$) are connected in common. Each block in the second-stage are supplied with four second-sense-enable signals $SY_{21}$ to $SY_{24}$. The column decoder 13 energizes one of the signals $SY_{21}$ to $SY_{24}$. Accordingly, one second-stage sense amplifier in every block is activated.

The true and complementary output signals ($2A_1$, $2B_1$) and ($2A_2$, $2B_2$) of the activated two second-stage sense amplifiers are supplied to two third-stage sense amplifiers $SA_{31}$ and $SA_{32}$, respectively. The sense amplifier $SA_{31}$ includes N-channel MOS transistors $Q_{17}$ to $Q_{19}$ and the amplifier $SA_{32}$ includes N-channel MOS transistors $Q_{21}$ to $Q_{23}$. P-channel MOS transistors $Q_{20}$ and $Q_{24}$ are provided as a common load of these two sense amplifiers $SA_{31}$ and $SA_{32}$. The transistors $Q_{19}$ and $Q_{23}$ are supplied at their gates with third-sense-enable signals $SY_{31}$ and $SY_{32}$. The column decoder 13 energizes one of the signals $SY_{31}$ and $SY_{32}$ in response to the column address signals. As a result, one of the memory cells $MC_{11}$ to $MC_{nm}$ is selected by the address signals $A_0$ to $A_i$, and the true and complementary signals of the data stored in the selected memory cell are outputted as output signals 3A and 3B of the third-stage sense amplifier.

P-channel MOS transistors $Q_{25}$ and $Q_{26}$ provided in accordance with the present invention are coupled in parallel to the transistors $Q_{20}$ and $Q_{24}$, respectively. The gates of the transistors $Q_{25}$ and $Q_{26}$ are supplied with a one-shot pulse signal $\phi$ from a one-shot pulse generator 18. These functions and effects will be described hereinafter in detail.

The output signals 3A and 3B of the third-stage sense amplifier are supplied to a first output amplifier $OA_1$ whose output signals are in turn supplied to a second output amplifier $OA_2$. The first output amplifier $OA_1$ includes N-channel MOS transistors $Q_{27}$ to $Q_{29}$ and P-channel MOS transistors $Q_{30}$ and $Q_{31}$, and the second output amplifier $OA_2$ includes N-channel MOS transistors $Q_{32}$ to $Q_{34}$ and P-channel MOS transistors $Q_{35}$ and $Q_{36}$. The gates of the transistors $Q_{29}$ and $Q_{34}$ operating as a current source are supplied with read-enable signal RE from the data write/read control circuit 14. This signal RE is held at the high level during a whole data-read period to maintain the transistors $Q_{29}$ and $Q_{34}$ into the conducting state. The output amplifiers $OA_1$ and $OA_2$ are thereby activated. The signal RE assumes the low level during a data-write period to inactivate the amplifiers OA$_1$ and OA$_2$.

The true and complementary output signals 4A and 4B of the second output amplifier OA$_2$ are supplied to an output circuit. The output circuit includes a P-channel MOS transistor Q$_{39}$ and an N-channel MOS transistor Q$_{40}$ connected in series between a power potential Vcc and a ground GND, and the connection point thereof is connected to a data output terminal 25. The gate of the transistor Q$_{39}$ is supplied with the signal 4A and that of the transistor Q$_{40}$ is supplied with the signal 4B via an inverter composed of a P-channel MOS transistor Q$_{37}$ and an N-channel MOS transistor Q$_{38}$. In the data-write operation, the signal RE assumes the low level to turn the transistor Q$_{34}$ OFF, and hence both of the output signals 4A and 4B of the second output amplifier OA$_2$ take the high level. As a result, both of the transistors Q$_{39}$ and Q$_{40}$ are brought into the nonconducting state. The data output terminal 25 thereby takes a high impedance stage.

Figure 4:
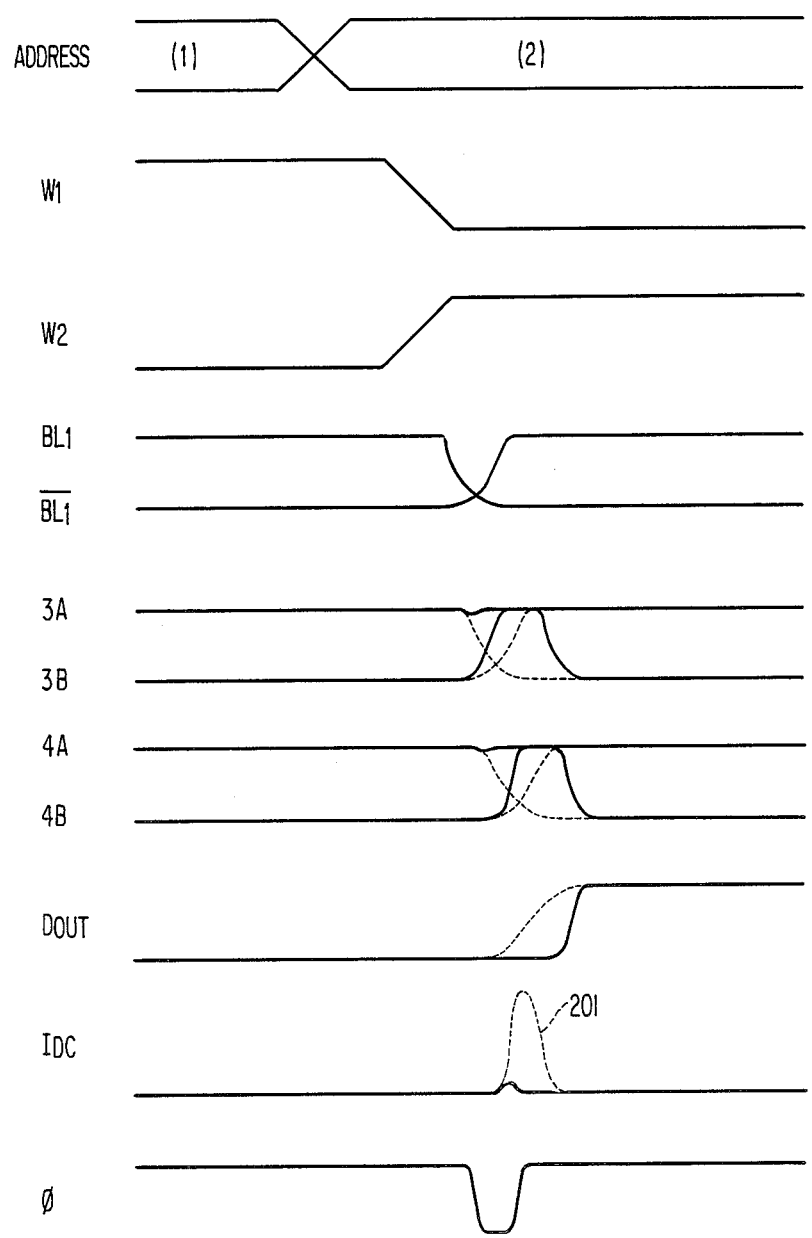
FIG. 4 is a timing chart representing a circuit operation of the second embodiment.

In the data-read operation, since the transistors Q$_{29}$ and Q$_{34}$ are in the conducting state, the output amplifier OA introduces the output of the sense amplifier SA. As shown in FIG. 4, assuming that address information (1) selects the memory cell MC$_{11}$ disposed at the intersection of the first word line W$_1$ and the first bit line pair (BL$_1$ and $\overline{BL}_1$) and that the selected memory cell MC$_{11}$ stores the data "0", the bit lines BL$_1$ and $\overline{BL}_1$ takes the high level and the low level, respectively. The output signals 3A and 3A of the third-stage sense amplifier SA$_{31}$ thereby assumes the high level and the low level, respectively. As a result, the second output amplifier OA$_2$ produces the high level output 4A and the low level output 4B to derive the low level output data D$_{OUT}$ from the terminal 25. When the address signal varies to the information (2) which changes only the selected word line from W$_1$ to W$_2$, the first bit line pair (BL$_1$ and $\overline{BL}_1$) are maintained to be in the selected state. That is, the sense-enable signals SY$_{11}$, SY$_{21}$ and SY$_{31}$ are continued to be energized. The memory cell MC$_{21}$ is thereby selected. This memory cell MC$_{21}$ stores the data "1" therein, and therefore the bit lines BL$_1$ and $\overline{BL}_1$ are changed to the low level and the high level, respectively.

The static type memory cell includes two transistors connected in a flip-flop form, and the current capabilities of them are frequency different from each other. For this reason, as shown in FIG. 4 as level changes of the bit lines BL$_1$ and $\overline{BL}_1$, the BL$_1$ is changed to the low level at a relatively high rate, whereas the $\overline{BL}_1$ is changed to the high level at a relatively small rate. Such level changes appear as those of the outputs 3A and 3B of the sense amplifier SA$_{31}$ represented by a dotted line in FIG. 4. In other words, both of the outputs 3A and 3B take a level near the low level at a transition time. As a result, the output amplifier OA$_2$ produces the output signals 4A and 4B whose levels are both near the low level. Both of the transistors Q$_{39}$ and Q$_{40}$ are thereby turned ON. Since the current ability of the transistors Q$_{39}$ and Q$_{40}$ are large, a considerably large penetrating current I$_{DC}$ flows as represented by a dotted line 201 in FIG. 4.

In order to prevent such a large penetrating current, the transistors Q$_{25}$ and Q$_{26}$ and the one-shot pulse generator 18 are provided. The one-shot pulse generator 18 receives a signal A$_x$ from the address buffer 10 and generates the one-shot pulse signal $\phi$ when any one of the address signals A$_0$ to A$_i$ changes. There is no necessity to generate the one-shot signal $\phi$ in a chip-unselected state and in a data-write operation. Therefore, the operation of the generator 18 is controlled by a signal C$_x$ from a chip-select control circuit 17 as well as a signal W$_x$ from the data write/read control circuit 14. As shown in FIG. 4, the one-shot pulse generator 18 generates the one-shot signal $\phi$ in synchronism substantially with the level change time point of the output signals of the third-stage sense amplifier SA$_3$. The pulse width of the one-shot signal $\phi$ is designed to be approximately equal to a time required to complete the level change of the signals 3A and 3B.

Accordingly, the one-shot pulse signal $\phi$ turns the transistors Q$_{25}$ and Q$_{26}$ ON when the sense amplifier SA$_{31}$ intends to change the levels of its outputs 3A and 3B in response to the variation of the address signals to the information (2). As shown in FIG. 4, the output 3A continues to take the substantially high level and the output 3B is inverted to the high level. The transistors Q$_{27}$ and Q$_{28}$ are thus turned ON and the transistors Q$_{32}$ and Q$_{33}$ are turned OFF to cause the second output amplifier OA$_2$ to produce the high level outputs 4A and 4B. As a result, both of the transistors Q$_{39}$ and Q$_{40}$ are turned OFF. The penetrating current I$_{DC}$ is reduced remarkably as represented by a solid line in FIG. 4.

At a time when the one-shot signal $\phi$ disappears, the gates of the transistors Q$_{17}$ and Q$_{18}$ are substantially in the high level and the low level, respectively. Therefore, the output 3A is inverted into the low level. On the other hand, the output 3B is held at the high level. As a result, the output 4A turns the transistor Q$_{39}$ ON to produce the high level output data D$_{OUT}$. At this time, since the transistor Q$_{40}$ is in the nonconducting state, no penetrating current I$_{DC}$ flows.

Figure 5:
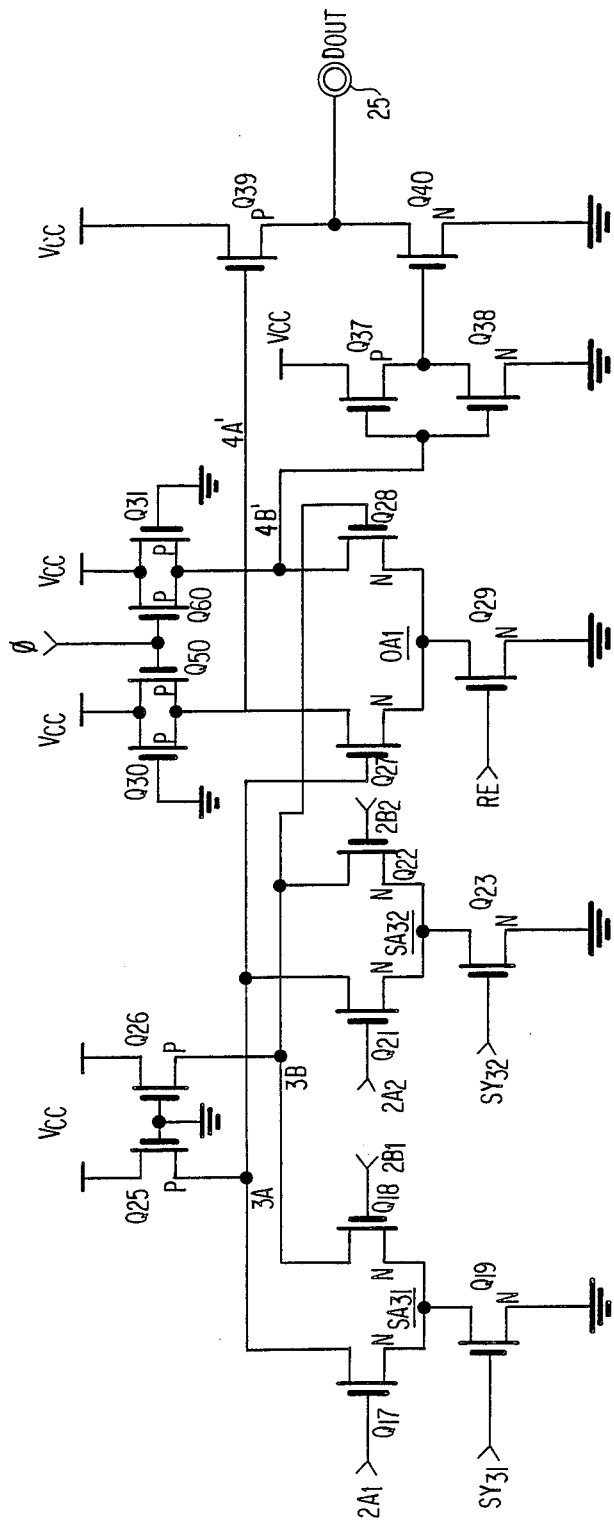
FIG. 5 is a circuit diagram showing a third embodiment of the present invention.

FIG. 5 shows a third embodiment of the present invention. This embodiment is also a semiconductor static memory, but only one part including a third-stage sense amplifier, an output amplifier and an output circuit is shown. The same constituents as those in FIG. 3 are denoted by the same characters to omit their further explanation. This semiconductor memory has only one output amplifier OA$_1$. Therefore, when both of the outputs 3A and 3B of the third-stage sense amplifier SA$_3$ are near the low level as described with reference to FIGS. 3 and 4, the outputs 4A' and 4B' of the output amplifier OA$_1$ go to the high level. The large penetrating current I$_{DC}$ is thus prevented.

Figure 6:
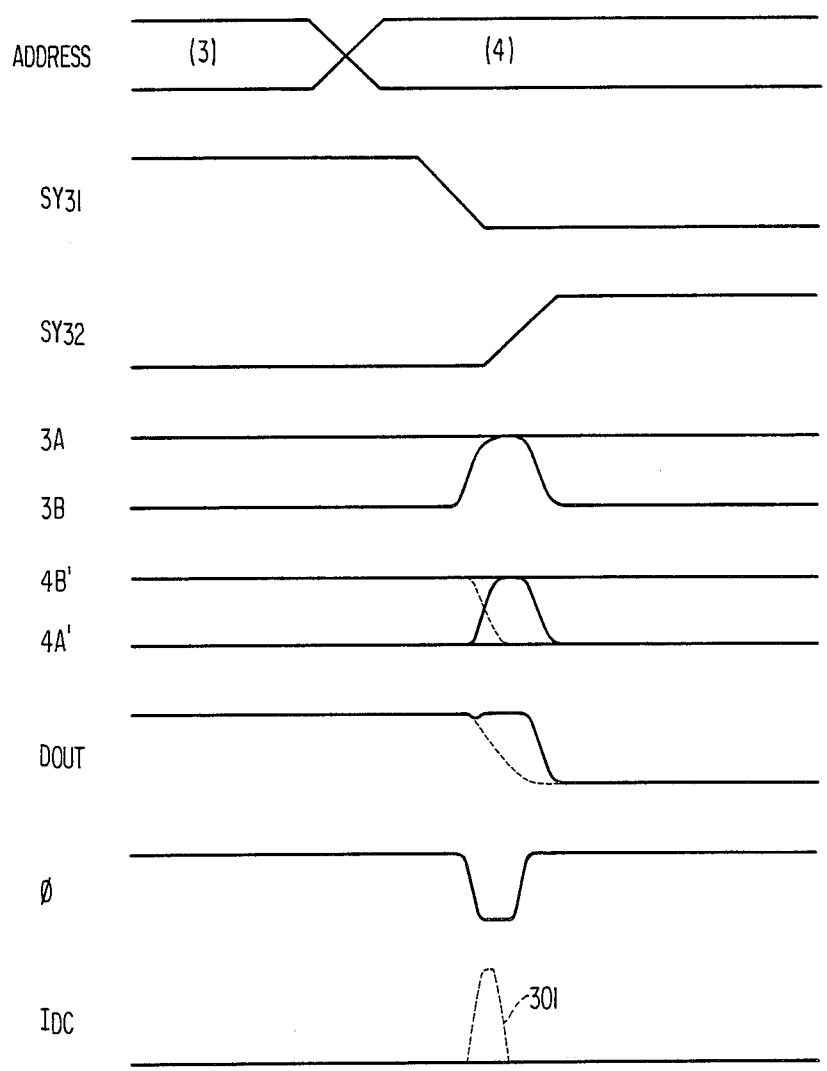
FIG. 6 is a timing chart representing a circuit operation of the third embodiment.

However, when the selected bit line pair is changed in response to the variation of the address signal, in particular when the energization of the third-sense-enable signal is changed from SY$_{31}$ to SY$_{32}$, a large penetrating current would flow. More specifically, the energization of the signal SY$_{31}$ responsive to the address information (3) causes the third-stage sense amplifier SA$_{31}$ to output the high level signal 3A and the low level signal 3B, as shown in FIG. 6. Accordingly, the output amplifier OA$_1$ produces the low level output 4A' and the high level output 4B' to generate the high level output data D$_{OUT}$. The address signal changes thereafter to the address information (4) which energizes the signal SY$_{32}$. It is noted that the activation of both third-stage sense amplifiers SA$_{31}$ and SA$_{32}$ should be avoided in order to prevent the destruction of the data stored in the memory cell. For this purpose, the column decoder 13 (FIG. 3) changes the signal SY$_{31}$ to the low level and thereafter energizes the signal SY$_{32}$ to the high level. As a result, both of the sense amplifiers SA$_{31}$ and SA$_{32}$ are brought into the inactivated state during a transition period in which the activated sense amplifier is changed from SA$_{31}$ to SA$_{32}$. Since the transistors Q$_{25}$ and Q$_{26}$ provided as a common load of the sense amplifiers SA$_{31}$ and SA$_{32}$ are in the conducting state, both of the output signals 3A and 3B assume the high level during that transition period, as shown in FIG. 6. For this reason, the output amplifier OA$_1$ changes both of its outputs 4A' and 4B' to the low level, so that the transistors Q$_{39}$ and Q$_{40}$ are turned ON. A large penetrating current I$_{DC}$ represented by a dotted line 301 in FIG. 6 thus flows.

In order to prevent such a large current, P-channel MOS transistors Q$_{50}$ and Q$_{60}$ are connected in parallel to the transistors Q$_{30}$ and Q$_{31}$, respectively, and the one-shot pulse $\phi$ is supplied to the gates of Q$_{50}$ and Q$_{60}$ in accordance with the present invention. The one-shot signal $\phi$ is generated in synchronism substantially with the output level change of the sense amplifier SA$_3$ in response to the address variation, as described with reference to FIG. 3. As a result, both of the outputs 4A' and 4B' of the output amplifier OA$_1$ assume the high level during the transition period to turn the transistors Q$_{39}$ and Q$_{40}$ OFF. The large penetrating current is thereby prevented. When the one-shot signal $\phi$ disappear, one of the transistors Q$_{39}$ and Q$_{40}$ is turned ON in response to the read-out data. In this description, the transistor Q$_{40}$ is turned ON to produce the low level output data D$_{OUT}$.

Figure 7:
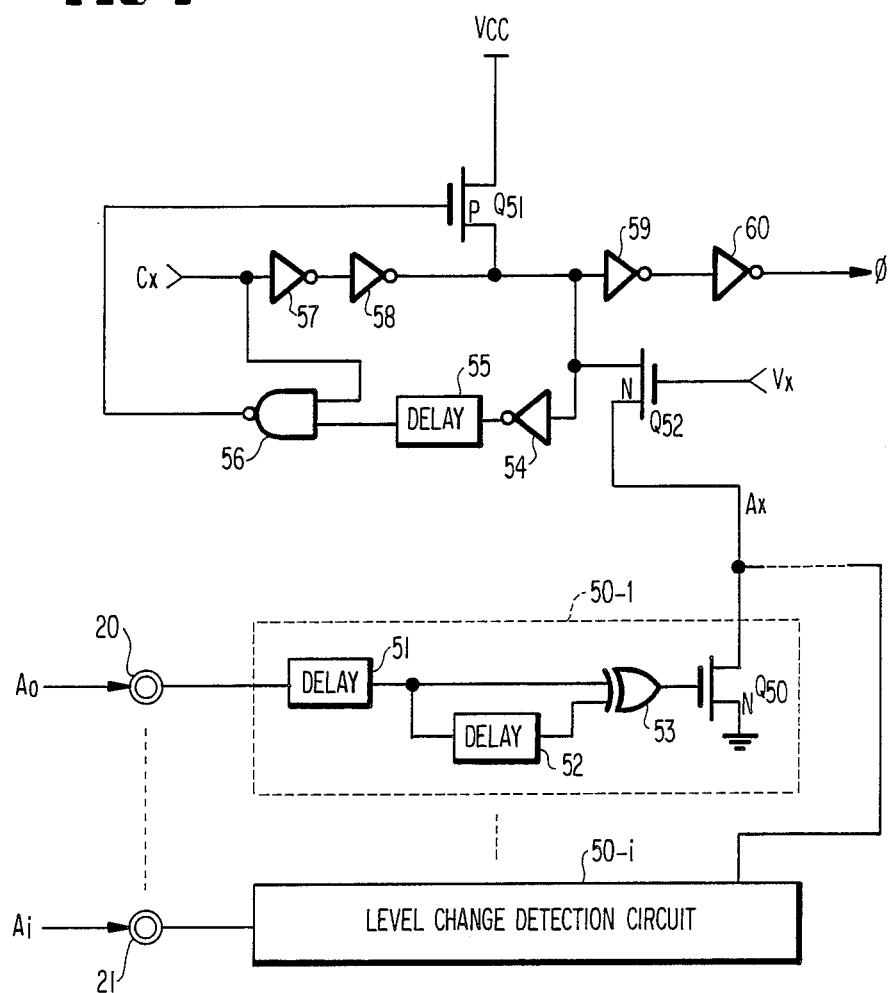
FIG. 7 is a circuit diagram of a one-shot pulse generator shown in FIG. 3.

In FIG. 1, the one-shot pulse generator 6 can be constituted a delay circuit and a logic gate such as an NAND gate or an AND gate as well-known in the art, and therefore its detailed construction will be omitted. The one-shot pulse generator 18 shown in FIG. 3 will be described below with reference to FIG. 7.

Since the signal A$_x$ is produced in response to the level change of any one of the address signals A$_0$ to A$_i$, level change detection circuits 50-1 to 50-i are provided for the address terminals 21 to 22, respectively. Each of the detection circuits 50-1 to 50-i includes two delay circuits 51 and 52, an exclusive OR circuit 53, and an N-channel MOS transistor Q$_{50}$. Accordingly, the transistor Q$_{50}$ is turned ON to invert the signal A$_x$ to the low level when any one of the address signals A$_0$ to A$_i$ varies. The timing point at which the transistor Q$_{51}$ is turned ON is determined by the delay time of the circuit 51. Since the signal C$_x$ assumes the low level during the chip-unselected period, the signal $\phi$ is held at the low level by four inverters 57 to 60. In the data-write operation, the signal W$_x$ is in the low level, and thus an N-channel MOS transistor Q$_{52}$ is in the nonconducting state. Therefore, the one-shot pulse $\phi$ is not generated irrespective of the address change during the chip-unselected period and the data-write operation period. In the data-read operation, the signals C$_x$ and W$_x$ are in the high level, and the signal A$_x$ assumes the high level except for the address change. The signal $\phi$ is thus in the high level. When the signal A$_x$ is inverted to the low level in response to the address change, the signal $\phi$ changes to the low level. The output of an inverter 54 is changed to the high level, and this high level is supplied through a delay time 55 to an NAND circuit 56. An P-channel MOS transistor Q$_{51}$ is thereby turned ON to return the signal $\phi$ to the high level. The delay time of the circuit 55 determines the pulse with of the one-shot signal $\phi$. Thus, the one-shot pulse $\phi$ is generated with a desired timing responsive to the address change and with a desired pulse width by presetting the delay times of the delay circuits 51 and 55.

The present invention is not limited to the above embodiments, but may be modified and changed without departing form the scope and spirit of the invention. For example, the transistors Q$_3$, Q$_4$, Q$_{25}$, Q$_{26}$, Q$_{50}$ and Q$_{60}$ can be replaced by an N-channel MOS transistor. In this case, the one-shot pulse $\phi$ is changed to the high level. Moreover, it is possible to generate the one-shot pulse $\phi$ in response to the input level change of the sense amplifier.

What is claimed is:

1. An output circuit comprising first and second power terminals, an output terminal, a first transistor connected between said first power terminal and said output terminal, a second transistor connected between said second power terminal and said output terminal, means for supplying an input signal to said first and second transistors in such a manner that said first and second transistors attain a push-pull operation, a one-shot pulse generator generating a one-shot pulse in response to a signal which is used for changing a logic level of said input signal, and means responsive to said one-shot pulse for turning both of said first and second transistors off.

2. The output circuit as claimed in claim 1, wherein said turning-off means includes a third transistor supplied with said one-shot pulse, means for coupling said third transistor between a control electrode of said first transistor and said first or second power terminal, a fourth transistor supplied with said one-shot pulse, and means for coupling said fourth transistor between a control electrode of said second transistor and said first or second power terminal.

3. A circuit comprising a signal processing circuit receiving an input signal and producing a data signal, an amplifier receiving said data signal and producing true and complementary signals of said data signal, first and second field effect transistors connected in series, first means for supplying said true signal to a gate of said first transistor, second means for supplying said complementary signal to a gate of said second transistor, a one-shot pulse generator generating a one-shot pulse at a transition time when logic levels of said true and complementary signals are changed by a variation in logic level of said data signal, a third field effect transistor turning said first transistor off in response to said one-shot pulse, and a fourth field effect transistor turning said second transistor off in response to said one-shot pulse.

4. The circuit as claimed in claim 3, wherein said first and second transistors are different in a conductivity type from each other and connected in series between first and second power terminals, one of said first and second means including an inverter, said amplifier having first and second output terminals from which said true and complementary signal are produced, respectively, said third transistor being connected between said first power terminal and said first output terminal, and said fourth transistor being connected between said first power terminal and said second output terminal.

5. A semiconductor memory comprising a sense amplifier amplifying a data signal read out from a selected memory cell, a data output terminal, an output circuit coupled between said sense amplifier and said data output terminal and producing at said data output terminal an output data signal responsive to an output signal of said sense amplifier, means for generating a one-shot pulse at a transition time when the output signal of said sense amplifier changes, and means responsive to said one-shot pulse for supplying to said output circuit a control signal that causes said output circuit to bring said data output terminal into a high impedance state.

6. The memory as claimed in claim 5, wherein said generating means generates said one-shot pulse in response to a variation in an address signal.

7. The memory as claimed in claim 6, wherein said supplying means includes a transistor, said transistor being connected in parallel to a load of said sense amplifier.

* * * * *

UNITED STATES PATENT AND TRADEMARK OFFICE
CERTIFICATE OF CORRECTION

PATENT NO. : 4,739,198

DATED : April 19, 1988

INVENTOR(S) : Maruyama

It is certified that error appears in the above-identified patent and that said Letters Patent is hereby corrected as shown below:

COLUMN 2, LINE 49   Delete "respeotively" and insert --respectively--;

COLUMN 2, LINE 60   Delete "chage" and insert --change--;

COLUMN 5, LINE 28   After "and" delete "$BL_1$" and insert $\overline{BL}_1$--;

COLUMN 7, LINE 64   Delete "with" and insert --width--;

COLUMN 8, LINE 3    Delete "form" and insert --from--.

Signed and Sealed this

Fifteenth Day of November, 1988

Attest:

DONALD J. QUIGG

Attesting Officer    Commissioner of Patents and Trademarks